(12) United States Patent
Bailey et al.

(10) Patent No.: US 10,004,165 B1
(45) Date of Patent: Jun. 19, 2018

(54) SELF-FILLING HUMIDITY CONTROL DEVICE FOR EQUIPMENT RACKS

(71) Applicant: Amazon Technologies, Inc., Seattle, WA (US)

(72) Inventors: Kevin Bailey, Seattle, WA (US); Felipe Enrique Ortega Gutierrez, Tacoma, WA (US); Mary Crys Calansingin, Auburn, WA (US); Darin Lee Frink, Lake Tapps, WA (US); Peter George Ross, Olympia, WA (US)

(73) Assignee: Amazon Technnologies, Inc., Seattle, WA (US)

( * ) Notice: Subject to any disclaimer, the term of this patent is extended or adjusted under 35 U.S.C. 154(b) by 0 days. days.

(21) Appl. No.: 15/455,883

(22) Filed: Mar. 10, 2017

(51) Int. Cl.
*H05K 7/20* (2006.01)
*F24F 6/00* (2006.01)

(52) U.S. Cl.
CPC ..... *H05K 7/20818* (2013.01); *H05K 7/20172* (2013.01); *H05K 7/20327* (2013.01); *H05K 7/20736* (2013.01); *H05K 7/20836* (2013.01); *F24F 2006/008* (2013.01)

(58) Field of Classification Search
None
See application file for complete search history.

(56) References Cited

U.S. PATENT DOCUMENTS

| | | | |
|---|---|---|---|
| 5,339,383 A * | 8/1994 | Marino | F22B 1/284 261/142 |
| 5,880,423 A * | 3/1999 | Li | F24H 9/2007 200/84 C |
| 6,089,237 A * | 7/2000 | Podolak, Jr. | A24F 25/02 131/300 |
| 6,134,109 A * | 10/2000 | Muller | H02B 1/565 165/104.33 |
| 6,135,427 A * | 10/2000 | Tsai | F24F 6/00 261/26 |
| 6,276,574 B1 * | 8/2001 | Smrt | B65D 83/262 222/646 |
| 6,462,944 B1 * | 10/2002 | Lin | G06F 1/181 165/80.3 |
| 8,251,136 B2 * | 8/2012 | Shibata | F24F 12/006 165/244 |
| 9,273,906 B2 * | 3/2016 | Goth | F28D 1/0477 |
| 2002/0050656 A1 * | 5/2002 | Offir | F24F 6/043 261/72.1 |
| 2004/0108604 A1 * | 6/2004 | Pan | F24F 6/00 261/26 |
| 2011/0292600 A1 * | 12/2011 | Campbell | F24F 3/14 361/691 |

(Continued)

*Primary Examiner* — Xanthia C Cunningham
(74) *Attorney, Agent, or Firm* — Kilpatrick Townsend & Stockton LLP

(57) ABSTRACT

A humidification assembly includes an enclosure, for example, arranged around a component of a datacenter. A base extends through a wall of the enclosure. Inside the enclosure, the base includes a well. Outside the enclosure, the base receives a container having a total volume that includes water and air. Water may flow from the container through a passage in the base to the well, for example, until equilibrium is reached and a predetermined water level in the well is thereby maintained. Water from the well thus provides a replenishing source of water to be evaporated for humidifying the air within the enclosure.

20 Claims, 5 Drawing Sheets

(56) References Cited

U.S. PATENT DOCUMENTS

| | | | |
|---|---|---|---|
| 2013/0099025 A1* | 4/2013 | McDonnell | F24F 6/00 |
| | | | 239/589 |
| 2013/0334716 A1* | 12/2013 | Ching | F24F 6/12 |
| | | | 261/81 |
| 2016/0169713 A1* | 6/2016 | Graff | F24F 11/0015 |
| | | | 73/431 |
| 2016/0348929 A1* | 12/2016 | Lee | F24F 6/04 |
| 2017/0010015 A1* | 1/2017 | Jan | F24F 3/1411 |
| 2017/0122604 A1* | 5/2017 | Song | F24F 11/30 |
| 2017/0356663 A1* | 12/2017 | Couperthwaite | F24F 6/18 |

* cited by examiner

SELF-FILLING HUMIDITY CONTROL DEVICE FOR EQUIPMENT RACKS

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a large part of the cost of operating a datacenter is related to the datacenter's cooling systems and the total electricity cost. Indeed, to limit cooling costs from excessive cooling, datacenters often rely on cooling systems designed specifically to handle the heat load expected to be produced by the particular equipment initially installed within that space. Often such cooling systems will cool an entire room that includes many similar types of computing units with similar heat waste needs. However, such arrangements may result in a lack of flexibility to alter components in use in a given datacenter room. For example, bulk cooling or conditioning of rooms may not readily permit different types of components to be used in the same room due to the possibility that a temperature and humidity range suitable for one type of component may not be suitable for another type of component.

BRIEF DESCRIPTION OF THE DRAWINGS

Various embodiments in accordance with the present disclosure will be described with reference to the drawings, in which.

DETAILED DESCRIPTION

Figure 1:
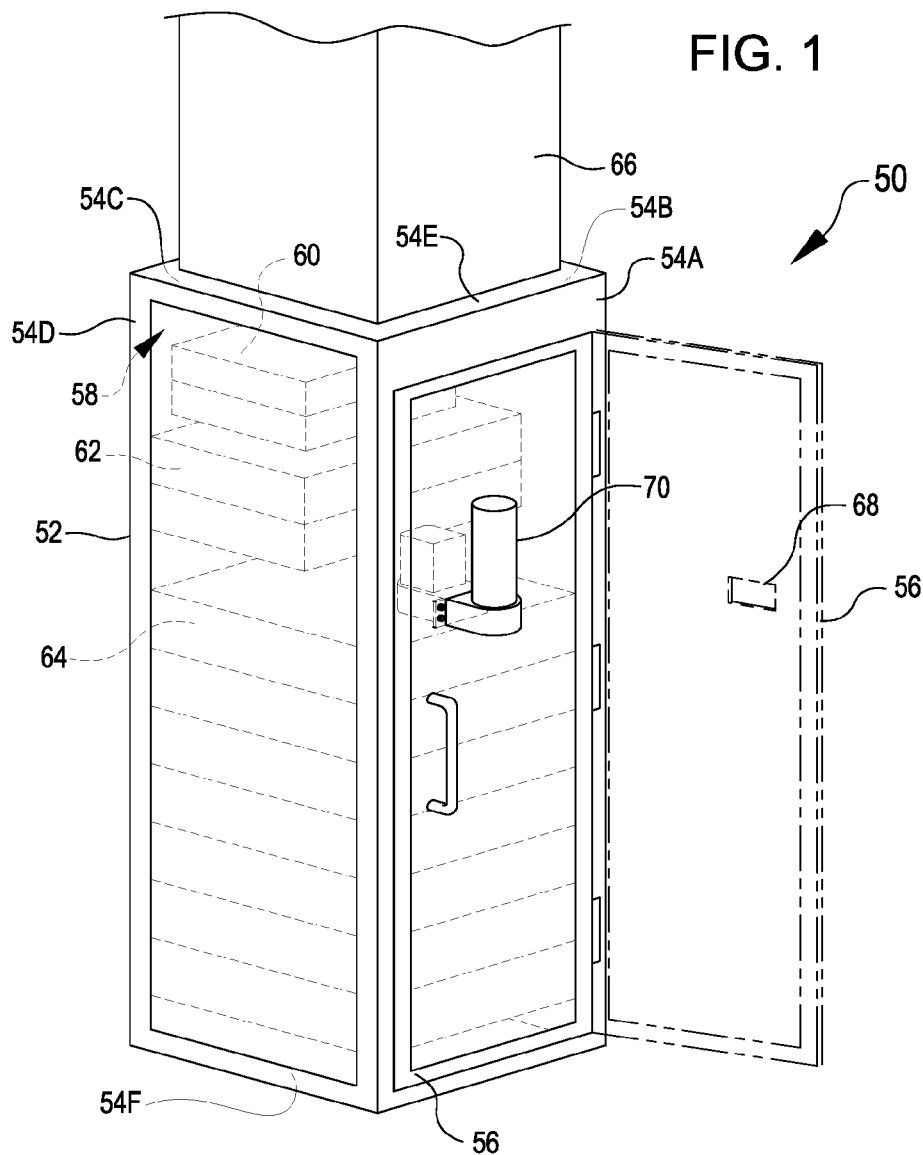
FIG. 1 illustrates an enclosure of a climate control system according to certain embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to climate control systems, for example, which may be particularly suited for use in a datacenter environment. Such a climate control system may utilize an enclosure about select components, which may allow regulation of environmental factors (such as humidity or temperature) for those select components to be controlled separately from an environment for other components outside the enclosure. As a particular example, such independent climate control systems may allow a datacenter room having row upon row of server racks to be retrofit to also include tape library units within enclosures, e.g., so that suitable environmental conditions for the tape library units can be maintained within the enclosures without substantially interfering with—or being interfered with by—different environmental conditions maintained for the server racks in the room. As another example, enclosures may be utilized about components with particular susceptibility to electrostatic discharge ("ESD"), for example to provide sufficient humidity to reduce a risk of ESD and corresponding damage to components.

In various embodiments, an independent climate control system can include a humidification assembly that traverses a wall of the enclosure. Such arrangements may allow humidification within the enclosure to be maintained without disrupting a seal of the enclosure. For example, the humidification assembly may include a well that is positioned within the enclosure. Water from the well may be evaporated into air to increase humidity within the enclosure. A water level of the well may be maintained by water supplied through a passage from a bottle mounted outside of the enclosure. Upon depletion of the water in the bottle, the depleted bottle can be replaced with a fresh bottle of water outside the enclosure, thus permitting replacement or replenishment of water for humidification purposes without opening or otherwise breaching the enclosure.

Other components additionally or alternatively may be included to affect levels and/or rates of humidification within the enclosure. For example, a sponge or other dispersal media may be positioned within the well. This may cause water to be wicked upward from the well and may provide additional surface area for evaporation that may increase a rate and/or amount of humidification provided by the humidification assembly to air in an interior volume of the enclosure. Additionally or alternatively, an air-conditioning unit may extract humidity or moisture from within the enclosure (e.g., while regulating temperature of air within the enclosure), which may allow the humidity level within the enclosure to be maintained within a target range. The air-conditioning unit (or fan, blower, or other airflow system) may provide movement of air within the enclosure that may change a rate and/or amount of humidification resulting from contact of the air with water from the well.

In various embodiments, appropriate sensors may be included to facilitate operation and/or maintenance of the climate control system and/or humidification assembly. For example, the enclosure may include a humidity sensor to determine a humidity level near an electronic component or other relevant location within the enclosure, e.g., to determine what level of operation of the air-conditioning unit is warranted to maintain the humidity level within a target range. As another example, an appropriate sensor may be included to provide information about a water level in the bottle, well, or other feature of the humidification assembly, e.g., to facilitate timely replacement and/or replenishment of the bottle.

As previously noted, systems described herein may find particular suitability to implementation with tape library units. Tape library units may include magnetic tape data storage components. Such tape may be utilized as a cost-effective medium for backing up hard drives or other types of disk storage. For example, tape may be more compact and economic for storing data than disk storage for data that is to be infrequently accessed, such as in backup scenarios. The tape is typically packaged in tape cartridges or cassettes (collectively, "tape storage media") within a tape library unit. Operating ranges of environmental criteria may differ between tape library units and disk storage units such as servers. As an illustrative example, certain tape library units may call for operating ranges that include a temperature between about 16 degrees Celsius to about 25 degrees Celsius and a humidity between about 20 percent and about 50 percent, while certain servers or other disk storage unites may call for operating ranges that include a temperature between about 5 degrees Celsius and about 40 degrees Celsius and a humidity between about 8 percent and 85 percent. Tape library units may be organized and supported within tape library racks in use. In some embodiments, the tape library racks may be sized comparably to server racks, e.g., such that the tape library racks may be included in a same row as server racks.

In various embodiments, the climate control systems are used in a datacenter that includes internal walls or other structures that form separations between one or more hot and cold zones, or aisles. The cold aisle or aisles are used for providing cool air for the servers and/or network hardware and for access by workers or administrators. The hot aisle or aisles receive heat exhausted from servers and/or networking hardware within the datacenter. This heat is exhausted out of the datacenter by fans and/or natural convention currents that occur in the datacenter.

To aid in air flow, computing devices are arranged so that they draw air from a cold aisle and exhaust air into a hot aisle. For example, servers are mounted in the datacenter so that a front portion, including intake vents for cooling, faces and is exposed to a cold aisle of the datacenter. A rear portion, including an exhaust fan, faces a hot aisle of the datacenter. In this manner, the server is cooled by drawing cold air from the cold aisle and the air that is heated by the server is exhausted into the hot aisle. The servers or racks for the servers can be mounted so that they extend through a structure that separates a cold aisle and a hot aisle.

In a similar manner, networking or other hardware can be mounted so that air intake is exposed to the cold aisle, with exhaust fans exposed to a hot aisle. Because typical networking hardware includes exhaust on a side and intake on an opposite side, the networking hardware racks are typically positioned so that the intake is exposed to the cold aisle for drawing cold air, and the exhaust side is exposed to the hot aisle, permitting hot air from the networking hardware to blow into the hot aisle.

In operation, the cooling fans of the networking hardware draw cool air from a cold aisle and exhaust hot air into a hot aisle. Similarly, the fans for the servers draw air from a cold aisle into a hot aisle. Thus, the standard cooling structures supplied for servers and networking hardware provide air flow from the cold aisles, through the equipment, and into the hot aisles.

The hot air in the hot aisles flows to the top of the datacenter (e.g., via convention currents), and can be vented out of the datacenter. Cool air can be provided to the cold aisles by drawing air from outside the datacenter into the cold aisle, and/or from conditioned air being supplied to the cold aisle, for example from chillers. The chillers may correspond, for example, to computer room air handling units located around a periphery of—or remote from—a room with the hot and cold aisles. Fans may be provided to enhance convection flow.

Climate control systems may be implemented relative to a server rack, a network hardware rack, or a tape library rack. To avoid having to repeat varied terms throughout the description, as used herein in the specification and claims, any use of "rack" (even if modified specifically by "server," "network hardware," or "tape library" etc.) may be utilized to mean any of a server rack, a network hardware rack, a tape library rack, or a rack that includes any combination of these options. In some cases, network racks are turned sideways, and may require some spacing between network hardware racks for technician access, whereas servers exhaust out through a back exhaust fan, and thus server racks can be installed immediately adjacent to one another. The differentiation in these two structures may warrant some alterations to placement of humidification system elements relative to a given rack, but in general, embodiments herein can utilize the same structure of humidification system components for a row accommodating one type of rack (e.g., a server rack) as for a row accommodating another type of rack (e.g., a network hardware rack).

Figure 5:
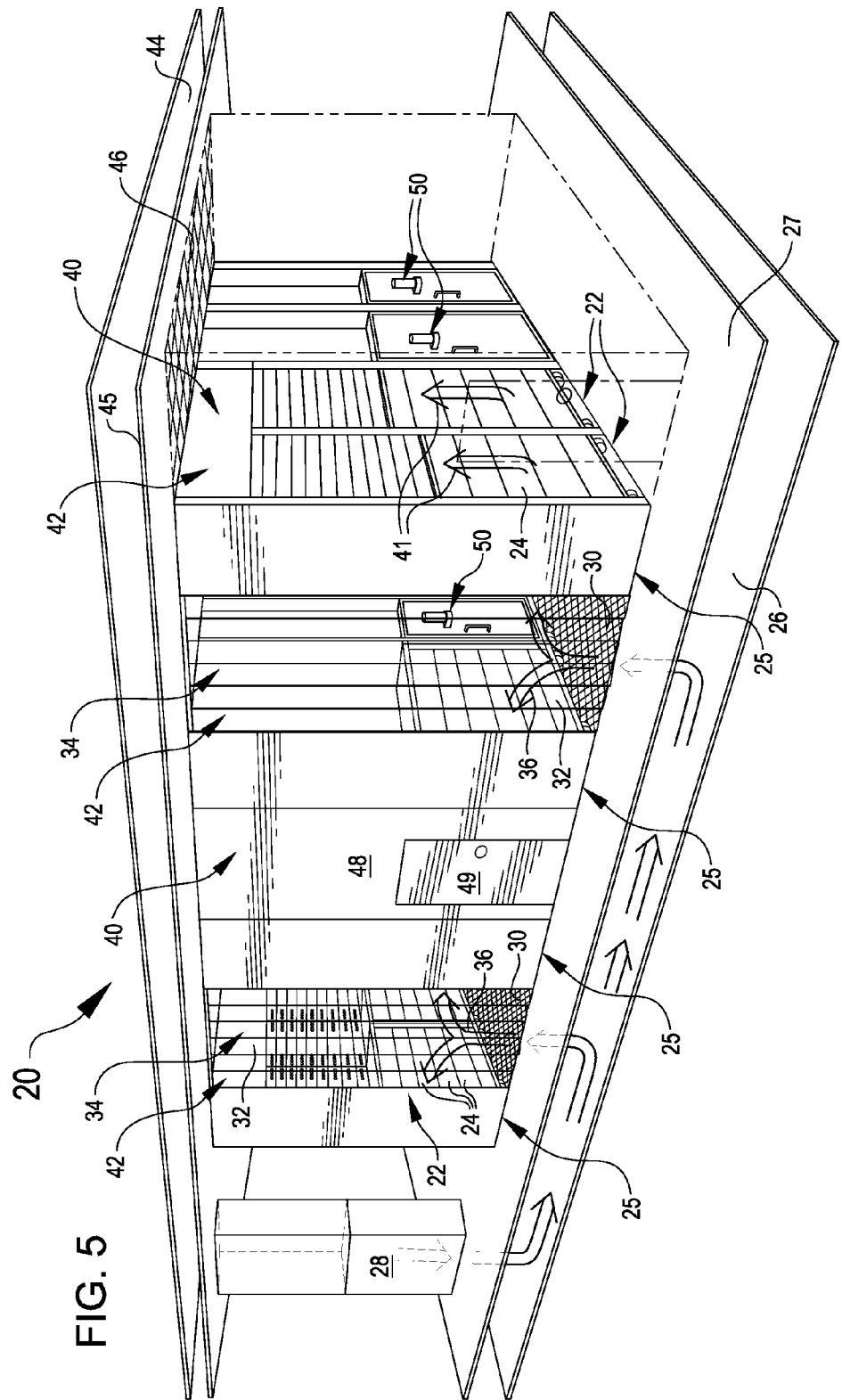
FIG. 5 illustrates an example of a datacenter in which humidification assemblies described herein may be included according to certain embodiments.

Reference will now be made to the drawings, in which like reference numerals represent like elements throughout the several views. Turning first to FIG. 5, FIG. 5 shows a datacenter 20 in accordance with embodiments. The datacenter 20 includes several server racks 22 having servers 24 mounted therein. Although the servers 24 are diagrammatically shown as rectangles in the drawings, the servers may fill only portions of the rack, as is known. As described above, the server racks 22 may alternatively include other datacenter components (e.g., network hardware equipment), not shown in FIG. 1.

The datacenter 20 includes a cooling flow defining hot and cold aisles, as described above. In various embodiments shown in the drawings, a cold air plenum 26 is attached to a cold air supply 28, which may be, for example, chillers, air conditioning, outside air venting, computer room air handling units, and/or other cool air supply of an environmental control system. The cold air supply 28 is located at a periphery of a room of the datacenter 20, as is typical to allow as much space as possible in a climate-controlled space to be used for servers 24.

Air from the cold air plenum 26 flows through vents 30 in the floor 27 of the datacenter 20. The air that flows through the vent 30 flows into a cold aisle 34 for the datacenter. In various embodiments, chilled air in the cold aisle 34 can be contained by a cold air containment system, which may be, for example, air curtains 32. The cold air containment system (e.g., the curtains 32) prevents flow of the chilled air out of the cold aisle 34. As shown by the arrows 36, cold air from the cold air plenum 26 flows out of the vents 30 and into the server racks 22. This flow may be provided, for example, by the fans that are provided on the servers 24 or other network hardware equipment, as described above.

Hot aisles 40 are also provided in the datacenter 20. In FIG. 5, the hot aisles 40 are enclosed structures, and part of the wall for the far right hot aisle in FIG. 5 is depicted as transparent to show detail. As described above, these hot aisles 40 are isolated from the cold aisles 34 by the server racks 22 and the cold air containment system, in the example shown, the air curtains 32. In addition, in accordance with embodiments, a hot aisle containment structure 42 is provided for containing the hot air in the hot aisle and directing that air to a hot air plenum 44 in or above the ceiling 45 of the datacenter 20.

The hot aisle containment structure 42 includes structures that are assembled to seal the area around the back end of the server racks 22 in the datacenter 20. The hot aisle containment structure 42 prevents the flow of hot air exhausting from the servers 24 back toward the cold aisle 34 or other parts of the datacenter 20. Although the hot aisle containment structure 42 is shown in FIG. 5 as solid panels, in some embodiments, it may additional or alternatively include flexible structures such as curtains similar to the air curtains 32. In various embodiments, the hot aisle is enclosed by additional structures, such as walls 48 at the ends of the hot aisle. As shown in FIG. 5, such walls can enclose one side of a hot aisle 40 at the end of the datacenter 20. Doors 49 can be provided for access into the hot aisle 40.

Rows 25 are also defined in the datacenter 20. The rows 25 correspond to the space occupied by the server racks 22 when installed and/or the space designated for receiving the server racks 22 for installation. The rows 25 shown in FIG. 5 provide at least part of the separation between the hot aisles 40 and the cold aisles 34 of the datacenter 20.

Referring again to the air flow in the datacenter 20, as can be seen in FIG. 5, air flows from the cold air plenum 26, up through the grates 30 and into the cold aisles 34 (e.g., as shown by arrows 36). The chilled air is drawn through the servers 24 in the server racks 22 (e.g., through servers in the rows 25) and is exhausted by the servers into the hot aisles 40 (e.g., as shown by arrows 41). The air is heated as it cools the servers 24, and thus is warm or hot when it enters the hot aisle 40. The heated air then exits the hot aisle 40 and flows through vents 46 into the hot air plenum 44. The hot aisle containment structure 42 and the air curtains 32 (or other cold air containment systems) prevent or limit the flow of air along other flow paths than those just described.

The datacenter 20 in FIG. 5 is also shown with independent climate control systems 50. For example, each independent climate control systems 50 may be utilized to provide a suitable second environment (e.g., for tape library units) that is different from the first environment maintained in the room of the datacenter 20 (e.g., for other datacenter components such as the servers 22). Examples of features of independent climate control systems 50 are discussed in greater detail with reference to FIG. 1.

In the example shown in FIG. 1, the independent climate control system 50 includes an enclosure 52. The enclosure 52 shown is formed by a set of walls 54 (e.g., individually marked in FIG. 1 as front wall 54A, right wall 54B, rear wall 54C, left wall 54D, top wall 54D, and bottom wall 54F), for example, which may define a substantially cuboid or rectangular shape. In some embodiments, the enclosure 52 may be a rack enclosure and may be formed about a rack, for example, a rack for supporting servers 62, network components 60, tape library units 64, or some combination of these or other datacenter components. The set of walls 54 define an interior volume 58. The interior volume 58 may be suitably sealed from an exterior of the enclosure 52 to allow the interior volume 58 to maintain a different environment (e.g., a different temperature and/or humidity) than present in a space exterior of the enclosure 52. In one example, the interior volume 58 may correspond to a space maintained about an individual rack for maintaining an environment particular to that rack. However, more generally, the interior volume may correspond to any discrete space, including but not limited to an entire room for which air circulation is controlled, or an enclosure about multiple racks. A single door 56 is shown in the front wall 54A of the enclosure 52, although the enclosure 52 may additionally or alternatively feature a door on one or more other walls and/or include more than one door for providing access from the exterior of the enclosure 52 to the interior volume 58.

In FIG. 1, the interior volume 58 is shown housing tape library units 64, servers 62, and network components 60. In some embodiments, information from the tape library units 64 may be accessed by the server 62 and/or communicated by the network components 60 to other computing devices. In some embodiments, the interior volume 58 of the enclosure 52 may include a different combination of datacenter components than shown in FIG. 1.

An air-conditioning unit 66, is shown in FIG. 1 in communication with the interior volume 58. The air-conditioning unit 66 is depicted generally as a duct in FIG. 1, but may include any suitable components for regulating temperature and/or humidity within the internal volume 58. In various embodiments, the air-conditioning unit 66 may extract moisture from the air within the internal volume 58 in the process of cooling or otherwise regulating the temperature of the air in the interior volume 58. Accordingly, a humidification assembly 70 may be included, e.g., to offset the effect of the air-conditioning unit 66 by introducing moisture into the air in the internal volume 58 to maintain a suitable humidity level for the tape library unit 64 or other components positioned within the internal volume 58. For example, the door 56 or other wall 54 of the enclosure 52 may include an opening 68 in which the humidification assembly 70 may be installed (e.g., the opening 68 is shown in the door 56 in phantom line in FIG. 1 in the absence of the humidification assembly 70 for ease of viewing).

Figure 2:
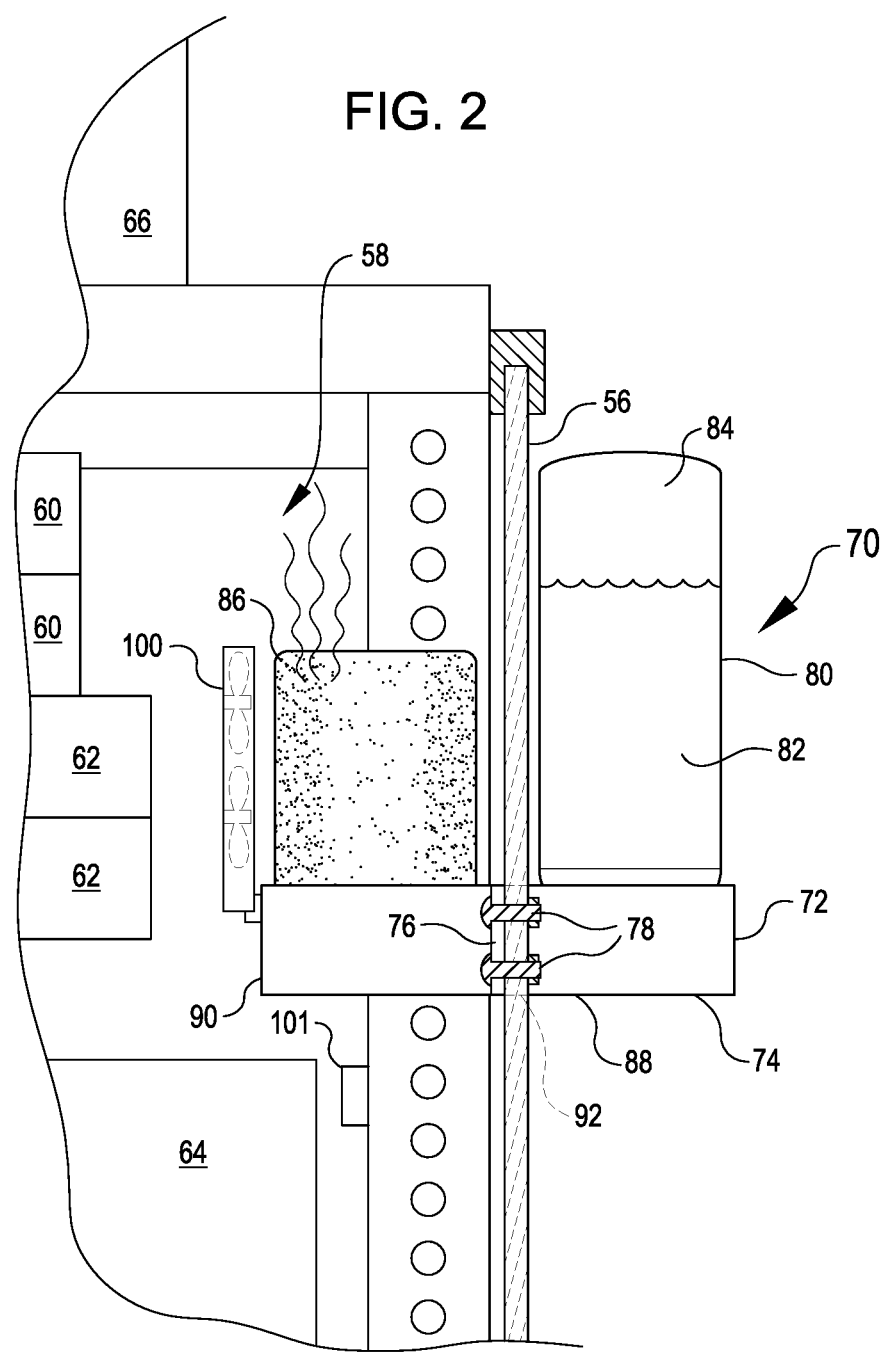
FIG. 2 illustrates a side cutaway view of a portion of the enclosure of FIG. 1 in which a humidification assembly is installed according to certain embodiments.

FIG. 2 illustrates a side cutaway view of a portion of the enclosure 52 with the humidification assembly 70 installed. As shown in FIG. 2, the humidification assembly 70 includes a base 72, a container 80 (e.g., illustrated with a form factor corresponding to a bottle), and a dispersal medium 86. The illustrated base 72 includes a body 74 and a mounting interface 76. The mounting interface 76 is depicted as a flange that secures the body 74 to the interior of the door 56 by bolts 78. However, the mounting interface 76 may utilize any other suitable mounting features including but not limited to sealing gaskets, a profile of the body 74 that fits snugly to the hole 68 in the door 56, features attached to the exterior and/or interior of the enclosure 52, fasteners other than bolts, etc.

The body 74 of the base 72 shown in FIG. 2 includes an exterior-facing projection 88, an interior-facing projection 90, and a middle section 92. The middle section 92 is received in the door 56 (or other wall 54 of the enclosure 52) and extends between the exterior-facing projection 88 and the interior-facing projection 90. In the illustrated arrangement, the interior-facing projection 90 is positioned within the interior volume 58, and the exterior-facing projection 88 is positioned outside the interior volume 58. In FIG. 2, the exterior-facing projection 88 supports the container 80, and the interior-facing projection 90 supports the dispersal medium 86.

Figure 3:
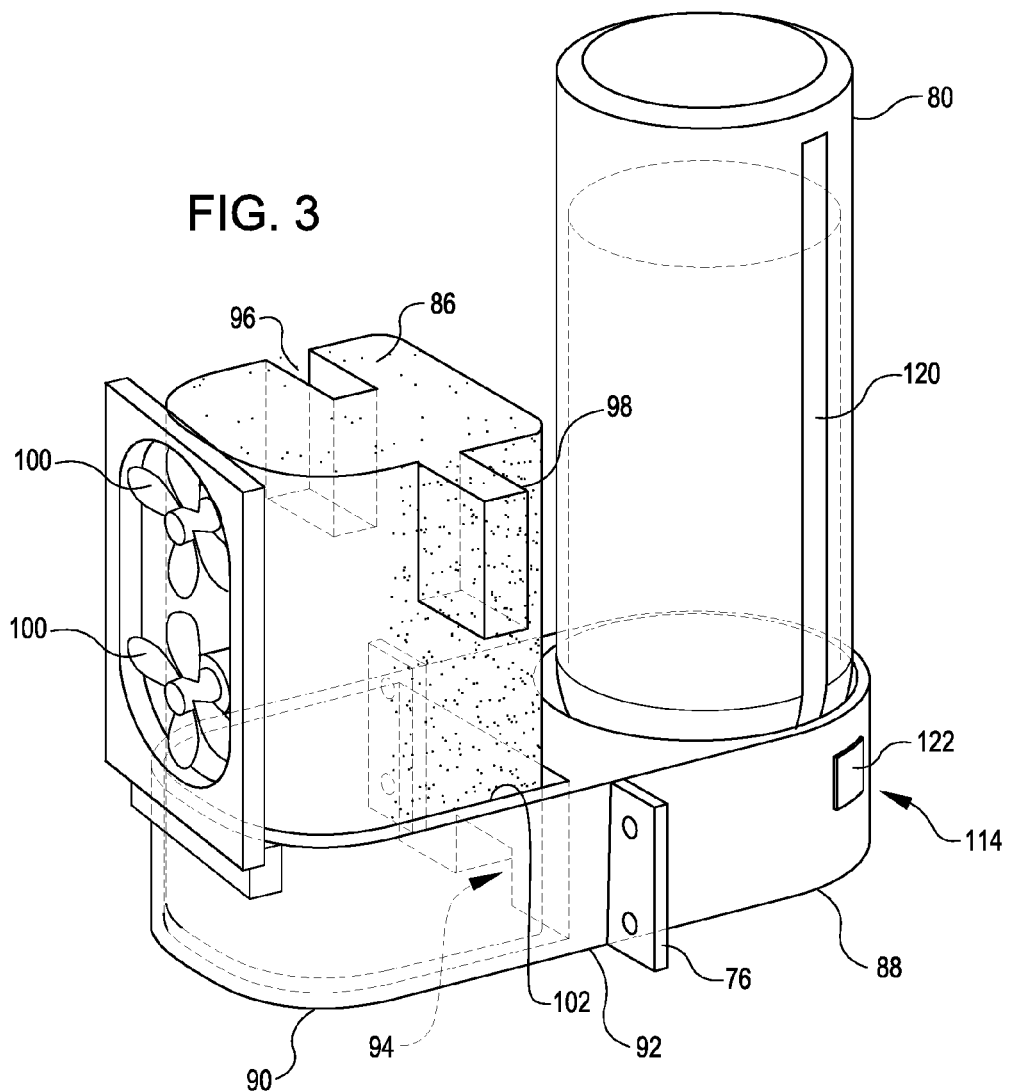
FIG. 3 illustrates a perspective view of components of the humidification assembly of FIG. 2 according to certain embodiments.

Referring to FIG. 3, the interior-facing projection 88 includes a well 102. The well 102 is shown extending downward from a top side of the interior-facing projection 88. In operation, the well 102 provides a source of water for exposure to air within the interior volume 58 for introducing moisture and increasing humidity within the interior volume 58.

In the arrangement shown in FIG. 3, the dispersal medium 86 is received in the well 102. The dispersal medium 86 shown in FIG. 3 has a footprint that substantially matches the footprint of the well 102. For example, the dispersal medium 86 may be press fit into the well 102. The dispersal medium 86 matching the footprint of the well 102 may reduce risk that water in the well 102 may slosh out of the well 102 apart from the dispersal medium 86 and on to the tape library unit 64 and/or other sensitive electronic components that may be within the interior volume 58. However, other arrangements are possible, and in some embodiments, the dispersal medium 86 occupies less than an entire footprint of the well 102.

The dispersal medium 86 may correspond to a sponge or other object capable of distributing water from the well 102. For example, the dispersal medium 86 may wick water upward from the well 102 toward a top of the dispersal medium 86. This may result in side and/or top surfaces of the dispersal medium 86 becoming wetted. The dispersal medium 86 may accordingly provide a larger amount of surface area from which water can be evaporated for introducing moisture into the air in the internal volume 58 than might otherwise be available in the absence of the dispersal medium 86 with the well 102 alone. The dispersal medium 86 may include any suitable features for providing expanded surface area. For example, the dispersal medium 86 may include any combination of recesses (such as grooves 96, pores, or cavities) or projections (such as fins 98) that may increase a surface area of the dispersal medium 86 beyond what might otherwise be available from the dispersal medium 86 in the absence of such recesses or projections. Accordingly, the dispersal medium 86 may be adjusted in size and/or features to adjust an amount and/or rate of moisture or humidity introduction to the air in the internal volume 58.

Other features additionally or alternatively may be included to affect a rate and/or amount of moisture or humidity introduction to the air internal volume 58. For example, a fan 100 is shown in FIG. 3 adjacent to the dispersal medium 86 and the well 102. The fan 100 may provide air flow to increase air circulation along the humidification assembly 70 and draw increased amounts of moisture into air in the internal volume 58. Although the fan 100 is shown attached to the interior-facing projection 90 of the body 74 in FIG. 3, other arrangements are also possible. For example, the fan 100 may be positioned in any suitable location within the interior volume 58 to facilitate air circulation relative to the humidification assembly 70. In some embodiments, the fan 100 may be supplemented and/or substituted by another blower or other air circulation system component, such as, but not limited to, the air-conditioning unit 66.

A fluid passage 94 is also shown in FIG. 3. The fluid passage 94 may extend through the middle section 92 of the base 72. The fluid passage 94 may be in communication with the well 102, e.g., to provide water or other fluid to the well 102.

Figure 4:
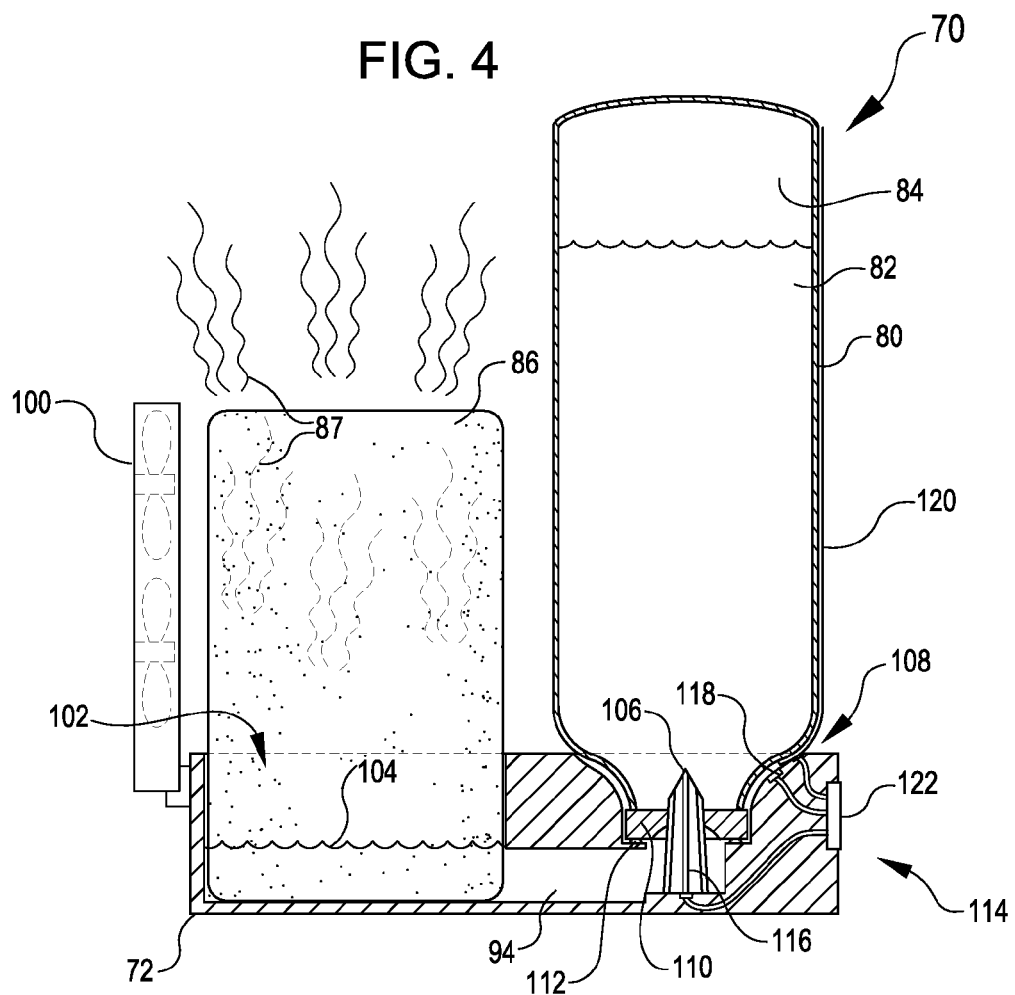
FIG. 4 illustrates a side cutaway view of the humidification assembly of FIG. 3 according certain embodiments.

Referring to FIG. 4, the well 102 may include a water level 104. The water level 104 may be maintained at a predetermined level within the well 102. For example, the water level 104 may be maintained based on water provided to the well 102 by the fluid passage 94. Some elements may be arranged relative to the water level 104. For example, the fluid passage 94 may be positioned below the water level 104. As another example, the dispersal medium 86 may be positioned so that a bottom of the dispersal medium is below the water level 104 and a top of the dispersal medium 86 is above the water level 104. In various embodiments, maintaining the water level 104 at a predetermined level may provide a replenishing supply of water to replace water that has been evaporated out of the well 102 to provide moisture or humidity to the internal volume 58.

In FIG. 4, the container 80 is shown having a form factor of a bottle. However, the container 80 may correspond to any suitable structure for containing a suitable combination of air 84 and water 82. For example, the total volume of the container 80 may contain substantially all water 82 and no air 84 (such as prior to installation in certain examples), substantially all air 84 and no water 82 (such as after any water 82 in the container 80 has been removed during use of the humidification assembly 70 in certain examples), or some part water 82 and some part air 84 (such as one half water 82 and one half air 84, one tenth air 84 and nine tenths water 82, or any other ratio prior to installation, during use, or after use of the container 80 relative to the humidification device 70). Hereinafter in this description and in the claims, for the sake of simplicity, the container 80 may occasionally be referred to as the bottle 80, and it is to be understood that the features described relative to a bottle may additionally or alternatively correspond to features that may interact with another form of container 80.

In FIG. 4, the bottle 80 is received in the body 74 of the humidification assembly 70 by a bottle-receiving interface 108. The illustrated bottle-receiving interface 108 includes a spike 116 for penetrating a cap 110 that otherwise seals air 84 and water 82 within the bottle 80. In some embodiments, the spike 116 may be omitted, and the bottle 80 may be installed without a cap 110 or with a cap 110 punctured by some other mechanism, for example. The illustrated bottle-receiving interface 108 is also shown with an appropriate seal 112 (e.g., an O-ring) situated to constrain flow of water 82 from the bottle 80 into the passage 94 when the bottle 80 is received by the bottle-receiving interface 108.

In various embodiments, the water level 104 in the well 102 may be maintained at a predetermined level in response to water supplied from the container 80. For example, with reference to FIG. 4, as water is drawn out of or extracted from the well 102 (e.g., via wicking up through the dispersal medium 86 or otherwise being evaporated out of the well 102 to humidify air in the enclosure 52 as at 87), water from the container 80 may flow into the well 102 to replace or replenish the water extracted from the well 102. Such replenishment may occur as a passive or automatic process (e.g., without need for pumps or other pressurizing components) based on the humidification assembly 70 operating about an equilibrium state.

For example, as shown in FIG. 4, the container 80 includes a total volume that is occupied in part by water 82 and in part by air 84. The air 84 has a lower density than the water 82 and thus is positioned above the water 82. The air 84 is thus trapped in a portion of the container 80 sealed off from an exterior of the container 80. Accordingly, the air 84 in the container 80 is isolated from air outside of the container 80. Such isolation may prevent air 84 in the container 80 from equalizing in pressure with air outside of the container 80 and may cause the isolated air 84 in the container 80 to resist expansion or contraction. The air 84 in the container 80 may accordingly exert a vacuum-like suction effect on the water 82 in the container 80. This suction effect may prevent the water 82 in the container 80 from flowing from the container 80 to the well 102 when the water level 104 in the well 102 is at or above the predetermined level, for example, thus preventing water flow that might otherwise overflow the well 102. Fundamentally, this result may occur because more air 84 is needed to take space at the top of the container 80 to replace space previously filled by the water 82 if the water 82 is to flow from the container 80. Although gravity is pulling on the water 82 and urging the water 82 to flow out of the container 80, the volume occupied by the air 84 would need to expand and take up more space to allow a flow that would permit the water 82 to vacate the space. However, the air 84 does not expand or contract sufficiently in response to the pull of the water 82 because the air pressure is stronger than the pull of gravity on the water 82. As a result, the water 82 stays in place within the container 80 when the air 84 in the container 80 is isolated from external sources of air. In contrast, as water is extracted from the well 102 by evaporation and/or the dispersal medium 86, the water level 104 in the well 102 may begin to drop below a top of the fluid passage 94. This may allow air to travel along the top of the fluid passage 94 and up into the container 80 to join the air 84 in the container 80 and take up sufficient space to relieve the suction effect and allow the water 82 in the container 80 to flow through the fluid passage 94 and into the well 102 until the predetermined water level 104 is reached again, thus blocking further air passage and re-establishing the suction effect within the container 80 that allows the equilibrium at which the water level 104 is maintained at the predetermined level. In this way, the humidification assembly 70 can provide a passive method of humidifying the air within the internal volume 58 of the enclosure 52 without requiring motors, compressors, steam vaporizers, ultrasonic nebulizers, or other driven components that may utilize significant amounts of energy to introduce humidity into a space.

In some embodiments, the humidification assembly 70 may continue introducing humidity into the internal volume 58 of the enclosure 52 until a saturation level is reached. The rate of humidification from the humidification assembly 70 may vary, for example, slowing down as the humidity level approaches the saturation level. In some embodiments, the air conditioning unit 66 or other humidity reducing component may prevent the humidity in the internal volume 58 from reaching the saturation level or exceeding a threshold range.

Any form of suitable sensor may be utilized to provide an electrical signal regarding an amount of water 82 remaining in the bottle 80. For example, the humidity assembly 70 shown in FIG. 4 includes a conductive sensor input 116 (e.g., one or more wires extending up through the spike 106 so that a change in conductivity corresponding to a level of water 82 in the bottle 80 falling below the wires and exposing the wires to the air 84 in the bottle 80 may be detected to indicate that the amount of water 82 remaining in the bottle 80 is below a particular threshold that may warrant replacement of the bottle 80). As another example, the humidity assembly 70 shown in FIG. 4 includes an optical sensor input 118 (e.g., an optical detector that may detect a change in an optical characteristic of the bottle 80 corresponding to a change from that portion of the bottle 80 including water 82 to including air 84 as an indicator that the level of water 82 in the bottle 80 has fallen below the placement of the optical detector). As a further example, the humidity assembly 70 shown in FIG. 4 includes a capacitive sensor input 120 (e.g., a capacitive strip that may extend up a side of the bottle 80 so that differences in capacitance of the bottle corresponding to areas adjacent to water 82 versus areas adjacent to air 84 can be detected to determine a level of water 82 remaining in the bottle 80). The humidification assembly 70 additionally or alternatively may include fewer, more, and/or other sensor inputs than those specifically described. In some embodiments, sensor inputs on the bottle 80 may interact with wiring or other elements situated in or on the base 72. Additionally, although certain sensor inputs are shown on the bottle 80 or on the base 72, sensor inputs may be located in any suitable location for gathering relevant information. Sensor inputs may be communicated to the sensor output 122 (such as a display or a wireless or other form of communication interface for communicating information from sensor inputs to another component). Obtaining an electrical signal that communicates information about a level of water 82 in the bottle 80 may be useful to facilitate monitoring of consumption of water from the bottle 80 and/or to facilitate alerts to replenish or change the bottle 80.

Other sensors may also be utilized. For example, referring again to FIG. 2, a humidity sensor 101 may be included. The humidity sensor 101 may be positioned adjacent or proximate a tape library unit 64 or other components for which humidity levels are controlled to maintain a suitable operating range. In some embodiments, the air-conditioning unit 66, the fan 100, and/or other elements may be controlled based on input from the humidity sensor 101, e.g., to offset or adjust the amount of moisture introduced by the humidification assembly 70.

Based at least in part on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Various embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A datacenter, comprising:
   a room;
   an environmental control system configured to maintain a first environment in the room;
   a plurality of datacenter components within the room, each comprising a server or a network hardware component;
   a set of walls defining a rack enclosure within the room, the rack enclosure having an interior volume having a second environment that is independent from the first environment;
   a tape library unit positioned within the interior volume of the rack enclosure and comprising tape storage media; and
   a humidification assembly mounted in a first wall of the set of walls, the humidification assembly comprising:
      a base comprising:
         an exterior-facing projection positioned in the first environment outside the interior volume and comprising a bottle-receiving interface,
         an interior-facing projection positioned in the second environment within the interior volume and comprising a well that extends downward from a top of the interior-facing projection, and
         a middle section positioned in the first wall and between the exterior-facing projection and the interior-facing projection, the middle section comprising a fluid passage in fluid communication with the bottle-receiving interface and the well; and
      a bottle received in the bottle-receiving interface in a sealing engagement that establishes fluid communication from the bottle through the fluid passage to the well such that water from the bottle is moved through the bottle-receiving interface and the fluid passage to the well for maintaining a predetermined water level in the well based on equilibrium between the bottle and the interior volume, wherein the well is configured to provide water for increasing a humidification level of the second environment in the rack enclosure separately from the first environment.

2. The datacenter of claim 1, wherein the second environment within the interior volume is independent from the first environment of the room by temperature or humidity.

3. The datacenter of claim 1, wherein the humidification assembly further comprises a sponge having a portion that sits in the well, the sponge having a sponge bottom positioned below the predetermined water level in the well and a sponge top positioned above a top of the well, the sponge configured to wick moisture up from the sponge bottom toward the sponge top such that sides of the sponge extending above the top of the well are available as wetted surface area from which moisture is introduced for increasing the humidification level of the second environment in the rack enclosure separately from the first environment.

4. The datacenter of claim 1, further comprising an air conditioning system configured to control a temperature of the second environment within the interior volume of the rack enclosure and to decrease the humidification level of the second environment in the rack enclosure separately from the first environment.

5. An assembly for a datacenter, the assembly comprising:
   a set of walls defining a rack enclosure about an interior volume that is separated by the set of walls from an exterior of the rack enclosure; and
   a humidification assembly mounted in a first wall of the set of walls, the humidification assembly comprising:
      a well that is positioned within the interior volume;
      a fluid passage in fluid communication with the well; and
      a container positioned outside of the interior volume and in fluid communication with the fluid passage for moving water from the container through the fluid passage to the well so as to maintain a predetermined water level in the well based on equilibrium between the container and the interior volume, wherein the well is configured to provide water for increasing a humidification level in the rack enclosure.

6. The assembly of claim 5, further comprising an o-ring arranged for receiving the container in a sealing engagement that establishes fluid communication from the bottle to the fluid passage.

7. The assembly of claim 5, further comprising a tape library unit positioned within the interior volume and comprising tape storage media.

8. The assembly of claim 5, wherein the humidification assembly further comprises a dispersal medium received in the well such that a bottom of the dispersal medium is positioned below the predetermined water level in the well and such that a top of the dispersal medium is positioned above the predetermined water level in the well.

9. The assembly of claim 8, wherein the dispersal medium has a footprint matching a footprint of the well.

10. The assembly of claim 8, wherein the dispersal medium includes pores, grooves, or extensions that provide surface area for introducing moisture into the interior volume of the rack enclosure.

11. The assembly of claim 5, wherein the first wall comprises a door and the humidification assembly is mounted in the door.

12. The assembly of claim 5, further comprising an air circulation system configured to cause air movement relative to the well so as to draw moisture from the well for increasing the humidification level of the interior volume in the rack enclosure.

13. A humidification assembly comprising:
   a base comprising:
      a body comprising an exterior-facing projection, an interior-facing projection, a middle section arranged between the exterior-facing projection and the interior-facing projection, and a mounting interface configured to couple the body with a wall so as to position the interior-facing projection on one side of the wall, the exterior-facing projection on an opposite side of the wall, and the middle section within the wall;
      a well that is disposed in the interior-facing projection and extending downward from a top of the interior-facing projection;

a fluid passage disposed within the middle section and in fluid communication with the well; and a bottle-receiving interface disposed in the exterior-facing projection and in fluid communication with the fluid passage such that a predetermined water level in the well is maintained by water communicated to the well through the fluid passage from the bottle-receiving interface in response to the bottle-receiving interface having received therein a bottle containing water for supplying to the well for maintaining the predetermined water level in the well based on equilibrium between the bottle and the interior volume.

14. The humidification assembly of claim 13, further comprising the bottle.

15. The humidification assembly of claim 13, further comprising a sensor configured to provide an electrical signal indicative of an amount of water remaining in the bottle.

16. The humidification assembly of claim 13, wherein the fluid passage is positioned below the predetermined water level.

17. The humidification assembly of claim 13, wherein the mounting interface comprises a flange for coupling the body with the wall.

18. The humidification assembly of claim 13, wherein the bottle-receiving interface comprises a spike configured to puncture a lid of the bottle during installation.

19. The humidification assembly of claim 13, further comprising:

a dispersal medium received in the well such that a bottom of the dispersal medium is positioned below the predetermined water level in the well and such that a top of the dispersal medium is positioned above the predetermined water level in the well; and a fan or blower positioned to move air across surface area of the dispersal medium so as to draw moisture for increasing the humidification level of air moved by the fan or blower.

20. The humidification assembly of claim 13, wherein the wall is a wall of datacenter rack enclosure.

* * * * *

UNITED STATES PATENT AND TRADEMARK OFFICE
CERTIFICATE OF CORRECTION

PATENT NO. : 10,004,165 B1
APPLICATION NO. : 15/455883
DATED : June 19, 2018
INVENTOR(S) : Kevin Bailey et al.

Page 1 of 1

It is certified that error appears in the above-identified patent and that said Letters Patent is hereby corrected as shown below:

On the Title Page

Item (73)
Delete: "Amazon Technnologies, Inc."
Insert: --Amazon Technologies, Inc.--

Signed and Sealed this
Twenty-third Day of July, 2019

Andrei Iancu
*Director of the United States Patent and Trademark Office*